United States Patent
Park

(10) Patent No.: US 9,953,723 B1
(45) Date of Patent: Apr. 24, 2018

(54) INPUT/OUTPUT TERMINAL CHARACTERISTIC CALIBRATION CIRCUIT AND SEMICONDUCTOR APPARATUS INCLUDING THE SAME

(71) Applicant: SK hynix Inc., Icheon-si Gyeonggi-do (KR)

(72) Inventor: Nak Kyu Park, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/455,949

(22) Filed: Mar. 10, 2017

(30) Foreign Application Priority Data

Oct. 17, 2016 (KR) .................. 10-2016-0134013

(51) Int. Cl.
*G11C 7/10* (2006.01)
*G11C 29/12* (2006.01)

(52) U.S. Cl.
CPC .. *G11C 29/1201* (2013.01); *G11C 2207/2254* (2013.01)

(58) Field of Classification Search
CPC ... G11C 29/1201; G11C 7/1084; G11C 29/12; G11C 7/1048
USPC ...................................................... 365/201
See application file for complete search history.

(56) References Cited

U.S. PATENT DOCUMENTS

| | | | |
|---|---|---|---|
| 6,919,738 B2 * | 7/2005 | Kushida | H03K 19/0005 326/30 |
| 7,019,556 B2 * | 3/2006 | Yoo | G11C 7/1051 326/26 |
| 2005/0057981 A1 * | 3/2005 | Yoo | G11C 7/1051 365/202 |
| 2015/0371691 A1 * | 12/2015 | Song | G11C 7/1084 365/189.05 |

FOREIGN PATENT DOCUMENTS

KR 1020090045568 A 5/2009

\* cited by examiner

*Primary Examiner* — Richard Elms
*Assistant Examiner* — Xiaochun L Chen
(74) *Attorney, Agent, or Firm* — William Park & Associates Ltd.

(57) ABSTRACT

An input/output terminal characteristic calibration circuit may include a plurality of input/output terminals a subset of which is configured to partially and selectively receive a characteristic calibration signal according to an external input, such that characteristics of the input/output terminals corresponding to the characteristic calibration signal are calibrated. The input/output terminal characteristic calibration circuit may also include a characteristic calibration signal generation circuit coupled to the plurality of input/output terminals in common through a test signal line, and configured to provide the characteristic calibration signal to the plurality of input/output terminals in common through the test signal line.

20 Claims, 5 Drawing Sheets

INPUT/OUTPUT TERMINAL CHARACTERISTIC CALIBRATION CIRCUIT AND SEMICONDUCTOR APPARATUS INCLUDING THE SAME

CROSS-REFERENCES TO RELATED APPLICATION

The present application claims priority under 35 U.S.C. § 119(a) to Korean application number 10-2016-0134013, filed on Oct. 17, 2016, in the Korean Intellectual Property Office, which is incorporated herein by reference in its entirety.

BACKGROUND

1. Technical Field

Various embodiments relate to a semiconductor circuit, and more particularly, to an input/output terminal characteristic calibration circuit and a semiconductor apparatus including the same.

2. Related Art

A semiconductor apparatus may include a plurality of input/output terminals for transmitting/receiving signals to/from an external device.

The plurality of input/output terminals may have a characteristic difference between input/output signals thereof, due to a difference in an off-chip architecture such as a system, module or package, or a PVT (Power, Voltage, or Temperature) difference at each region in a chip.

Thus, in order to improve the operation performance of the semiconductor apparatus, it is very important to optimize the characteristics of the plurality of input/output terminals.

As illustrated in FIG. 1, an input/output terminal characteristic calibration circuit 1 of a conventional semiconductor apparatus includes a plurality of input/output terminals 20, a characteristic calibration signal generation circuit 30, and a plurality of signal line sets 40.

The plurality of input/output terminals 20 may correspond to a final stage including a DQ pad of a semiconductor memory, for example.

Each of the input/output terminals 20 may include a pad, a receiver, and a transmitter.

The characteristic calibration signal generation circuit 30 may generate a characteristic calibration signal for calibrating operation characteristic-related items of the respective input/output terminals 20, according to a mode register set signal MRS.

At this time, the operation characteristic-related items may be associated with the operation characteristics of the receiver and transmitter, for example.

The operation characteristics of the receiver may include controlling an input setup/hold time, equalizing strength, and calibrating a current.

The operation characteristics of the transmitter may include calibrating a slew rate, on-resistance or output timing, and calibrating on-die termination strength.

As described above, the plurality of input/output terminals 20 may have a characteristic difference between input/output signals thereof, due to a difference in off-chip architecture such as a system, module or package, or a PVT difference at each region in a chip.

Therefore, in order to transmit a characteristic calibration signal for independently calibrating the difference in characteristics between the respective input/output terminals 20, the plurality of input/output terminals 20 and the characteristic calibration signal generation circuit 30 must be connected to each other through the independent signal line sets 40.

For example, when the characteristic calibration signal includes n bits and the number of input/output terminals 20 is set to 30, 30 signal line sets (30*n signal lines) are required.

The characteristic calibration signal generation circuit 30 may provide a characteristic calibration signal CTRL<1:m> to the plurality of input/output terminals 20 through the signal line sets 40, respectively.

In the conventional semiconductor apparatus, the input/output terminals 20 and the characteristic calibration signal generation circuit 30 are coupled through the independent signal line sets 40. Thus, because a large number of signal lines are required, the circuit area is inevitably increased, and there is a difficulty in designing an arrangement of the signals lines. Furthermore, as the number of operation characteristic-related items is increased, the number of signal lines may be increased. In this case, because the circuit area is increased design difficulties may arise.

SUMMARY

Various embodiments are directed to an input/output terminal characteristic calibration circuit capable of optimizing characteristics of a plurality of input/output terminals using a shared signal line, and a semiconductor apparatus including the same.

In an embodiment of the present disclosure, an input/output terminal characteristic calibration circuit may include: a plurality of input/output terminals a subset of which is configured to receive a characteristic calibration signal according to an external input, such that characteristics of the input/output terminals corresponding to the characteristic calibration signal are calibrated; and a characteristic calibration signal generation circuit coupled to the plurality of input/output terminals in common through a test signal line, and configured to provide the characteristic calibration signal to the plurality of input/output terminals in common through the test signal line.

In an embodiment of the present disclosure, an input/output terminal characteristic calibration circuit may include: a plurality of input/output terminals a subset of which is configured to receive a characteristic calibration signal according to a first enable signal and an external select signal inputted through a pad, such that characteristics of the input/output terminals corresponding to the characteristic calibration signal are calibrated; and a characteristic calibration signal generation circuit coupled to the plurality of input/output terminals in common through a test signal line, and configured to generate the first enable signal and the characteristic calibration signal and provide the first enable signal and the characteristic calibration signal to the plurality of input/output terminals in common through the test signal line.

In an embodiment of the present disclosure, a semiconductor apparatus may include: an input/output terminal characteristic calibration circuit configured to select one or more of a plurality of input/output terminals according to an external input which is input through each of the plurality of input/output terminals, and input a characteristic calibration signal to the selected input/output terminals through a test signal line such that characteristic of the selected input/ output terminals are calibrated; and a memory core coupled to the plurality of input/output terminals through a global input/output line.

BRIEF DESCRIPTION OF THE DRAWINGS

Features, aspects, and embodiments are described in conjunction with the attached drawings, in which.

DETAILED DESCRIPTION

Hereinafter, an input/output terminal characteristic calibration circuit and a semiconductor apparatus including the same according to the present disclosure will be described below with reference to the accompanying drawings through exemplary embodiments.

Figure 1:
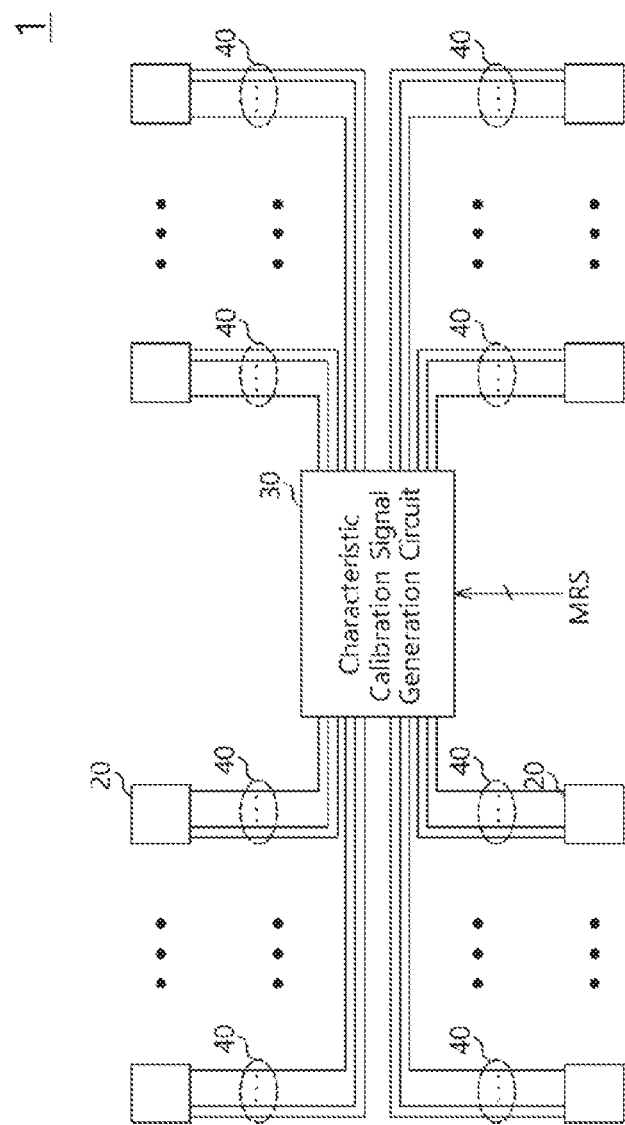
FIG. 1 is a diagram illustrating a configuration of an input/output terminal characteristic calibration circuit 1 of a conventional semiconductor apparatus.
Figure 2:
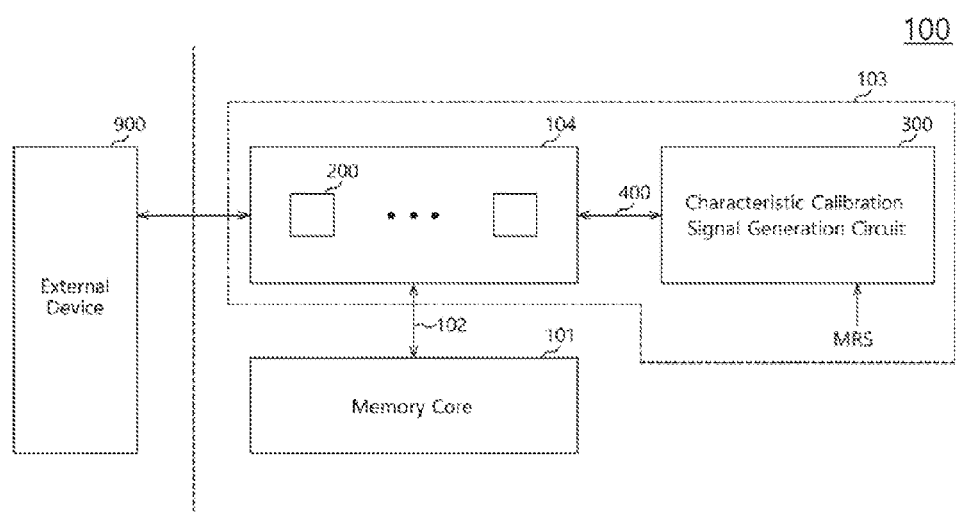
FIG. 2 is a diagram illustrating a configuration of a semiconductor apparatus according to an embodiment.

As illustrated in FIG. 2, a semiconductor apparatus 100 according to an embodiment may include a memory core 101, a global input/output line 102, and an input/output terminal characteristic calibration circuit 103.

The input/output terminal characteristic calibration circuit 103 may include an input/output terminal region 104 and a characteristic calibration signal generation circuit 300 which is coupled to a plurality of input/output terminals 200 of the input/output terminal region 104 in common through a test signal line 400.

The plurality of input/output terminals 200 may have operation characteristics which are calibrated according to a characteristic calibration signal.

The input/output terminal characteristic calibration circuit 103 may perform an independent calibration mode in which the circuit 103 selects one or more of the input/output terminals 200 according to an external input which is inputted through each of the input/output terminals 200. That is, an external device 900 outside the semiconductor apparatus 100 inputs the characteristic calibration signal only to the selected input/output terminal(s) 200 to calibrate the characteristics of the selected input/output terminal(s) 200 corresponding to the characteristic calibration signal.

The characteristic calibration signal generation circuit 300 may generate the characteristic calibration signal for calibrating operation characteristic-related items of one or more of the plurality of input/output terminals 200, according to an input signal, for example, a mode register set signal MRS. The characteristic calibration signal generation circuit 300 may also provide the generated characteristic calibration signal to the plurality of input/output terminals 200 in common through the test signal line 400.

At this time, the operation characteristic-related items may include a slew rate, driving strength and the like, as items related to transmission/reception characteristics.

The number of signal lines included in the test signal line 400 may be changed depending on the number of operation characteristic-related items, that is, the number of bits contained in the characteristic calibration signal to be transmitted through the test signal line 400. In other words, the characteristic calibration signal may include signal bits corresponding to the type of operation characteristic-related items.

For example, when the number of operation characteristic-related items is '1' and the number of required signal bits is '1', the test signal line 400 may include only one signal line for a one-bit characteristic calibration signal. For example, when the number of operation characteristic-related items is '10' and the number of required signal bits is '2', the test signal line 400 may include 20 signal lines for a 20-bit characteristic calibration signal.

The plurality of input/output terminals 200 may correspond to the final stage for receiving an address, command or the like from the external device 900 such as a CPU, GPU, or tester. Or, the plurality of input/output terminals 200 may correspond to the final stage for transmitting/receiving data to/from the external device 900. The final stage may, for example, include a DQ pad of a semiconductor memory.

Each of the input/output terminals 200 may include a pad.

One or more of the plurality of input/output terminals 200 may be selected according to an external input which is inputted to the pads, that is, a signal inputted to the pads by the external device 900. Only the input/output terminals 200 selected among the plurality of input/output terminals 200 may receive the characteristic calibration signal to calibrate characteristics of the selected input/output terminal(s) 200 corresponding to the characteristic calibration signal.

The external device 900 may input a predetermined signal, for example, a low pulse through the pad of an input/output terminal 200 which is to be calibrated among the plurality of input/output terminals 200, such that only the corresponding input/output terminal 200 receives the characteristic calibration signal provided from the characteristic calibration signal generation circuit 300.

The memory core 101 may be coupled to the plurality of input/output terminals 200 through the global input/output line 102.

The memory core 101 may include a memory cell array (not illustrated) and data input/output-related circuits (not illustrated) between the memory cell array and the global input/output line 102.

Figure 3:
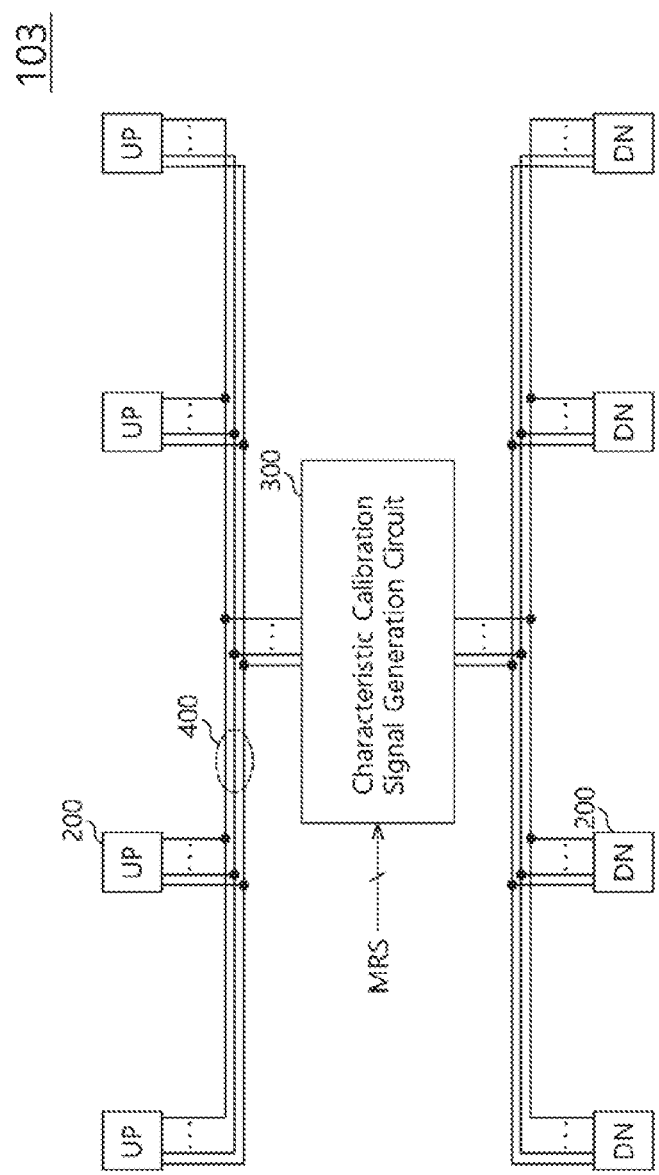
FIG. 3 is a diagram illustrating a configuration of an input/output terminal characteristic calibration circuit of the semiconductor apparatus according to the embodiment.

As illustrated in FIG. 3, the plurality of input/output terminals 200 in the input/output terminal characteristic calibration circuit 103 of the semiconductor apparatus according to an embodiment may be divided into an upper side UP and a lower side DN based on an arrangement of the pads included in the respective input/output terminals 200.

FIG. 3 only illustrates an example in which the test signal lines 400 are distributed according to the plurality of input/output terminals 200 divided into the upper side UP and the lower side DN, and the same characteristic calibration signal may be transmitted through the upper test signal lines 400 and the lower test signal lines 400.

Figure 4:
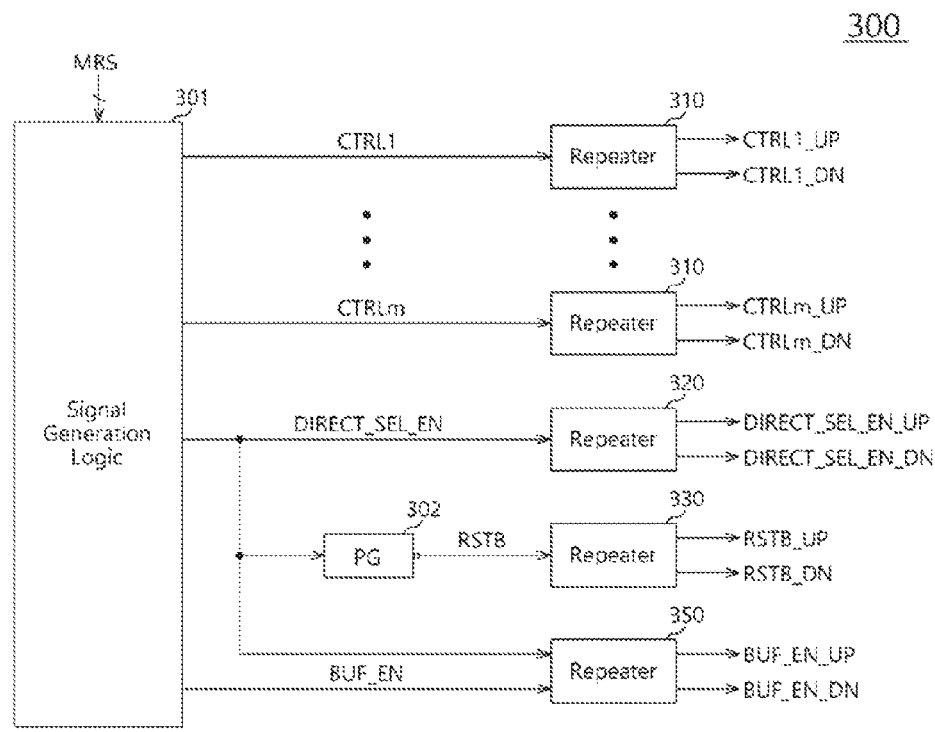
FIG. 4 is a diagram illustrating a configuration of a characteristic calibration signal generation circuit of FIG. 3.

As illustrated in FIG. 4, the characteristic calibration signal generation circuit 300 may include signal generation logic 301, a pulse generator (PG) 302, and a plurality of repeaters 310, 320, 330 and 350.

The signal generation logic 301 may generate the characteristic calibration signal CTRL<1:m> for calibrating the operation characteristic-related items of the respective input/output terminals 200 according to an input signal, for example, the mode register set signal MRS.

The signal generation logic 301 may further generate at least one of first and second enable signals DIRECT_SEL_EN and BUF_EN according to the mode register set signal MRS.

The pulse generator 302 may generate a reset signal RSTB according to the first enable signal DIRECT_SEL_EN.

The plurality of repeaters 310, 320, 330 and 350 may be configured to divide the signals generated by the signal generation logic 301, that is, the plurality of repeaters 310, 320, 330, and 350 may each divide the characteristic calibration signal CTRL<1:m>, the first and second enable signals DIRECT_SEL_EN and BUF_EN, and the reset signal RSTB outputted from the pulse generator 302, according to the plurality of input/output terminals 200 divided into the upper side UP and the lower side DN (refer to FIG. 2).

The plurality of repeaters 310 may divide the characteristic calibration signal CTRL<1:m> into CTRL<1:m>_UP and CTRL<1:m>_DN.

The repeater 320 may divide the first enable signal DIRECT_SEL_EN into DIRECT_SEL_EN_UP and DIRECT_SEL_EN_DN.

The repeater 330 may divide the reset signal RSTB into RSTB_UP and RSTB_DN.

When any one of the first and second enable signals DIRECT_SEL_EN and BUF_EN is activated, the repeater 350 may activate enable signals BUF_EN_UP and BUF_EN_DN.

Figure 5:
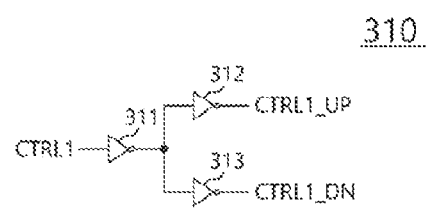
FIGS. 5 and 6 are diagrams illustrating configurations of repeaters of FIG. 4.

As illustrated in FIG. 5, the repeater 310 receiving the corresponding bit CTRL1 of the characteristic calibration signal CTRL<1:m> among the plurality of repeaters 310 may include first to third logic gates 311 to 313.

The first logic gate 311 may invert the bit CTRL1.

The second logic gate 312 may invert an output of the first logic gate 311, and output the inverted signal as CTRL1_UP.

The third logic gate 313 may invert the output of the first logic gate 311, and output the inverted signal as CTRL1_DN.

The repeater 320 and the repeater 330 may be configured in substantially the same manner as illustrated in FIG. 5.

Figure 6:
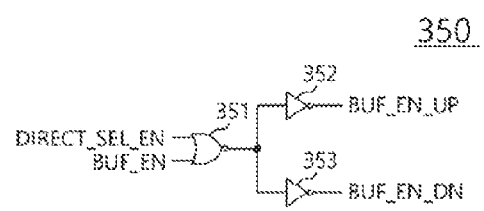

As illustrated in FIG. 6, the repeater 350 may include first to third logic gates 351 to 353.

The first logic gate 351 may perform an NOR operation on the first and second enable signals DIRECT_SEL_EN and BUF_EN.

The second logic gate 352 may invert an output of the first logic gate 351, and output the inverted signal as BUF_EN_UP.

The third logic gate 353 may invert the output of the first logic gate 351, and output the inverted signal as BUF_EN_DN.

Figure 7:
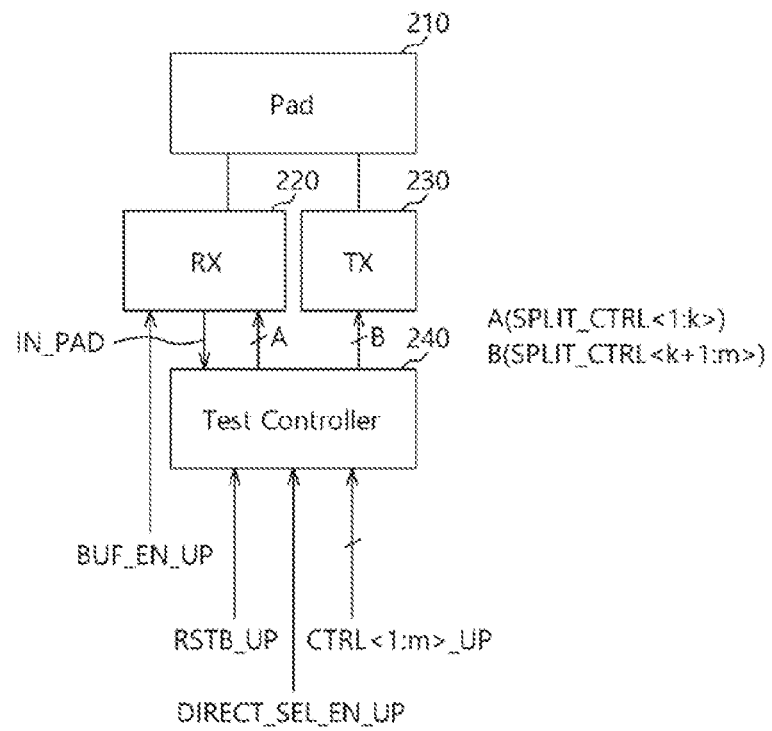
FIG. 7 is a diagram illustrating a configuration of an input/output terminal of FIG. 3.

As illustrated in FIG. 7, the plurality of input/output terminals 200, for example, the input/output terminals 200 in the upper side UP may include a pad 210, a receiver (RX) 220, a transmitter (TX) 230, and a test controller 240.

The pad 210 may be coupled to the receiver 220 and the transmitter 230.

The receiver 220 may transmit an external input, that is, a signal inputted through the pad 210 from the external device 900 as an external select signal IN_PAD to the test controller 240.

The receiver 220 may be enabled according to the second enable signal BUF_EN_UP.

The reception characteristic of the receiver 220 may be calibrated according to a part SPLIT_CTRL<1:k> of a latch signal SPLIT_CTRL<1:m>. The test controller 240 may input a part SPLIT_CTRL<1:k> of the characteristic calibration signal CTRL<1:m> to the receiver 220 according to, in one example, the first enable signal DIRECT_SEL_EN_UP and the external select signal IN_PAD.

The transmission characteristic of the transmitter 230 may be calibrated according to an other part SPLIT_CTRL<k+1:m> of the latch signal SPLIT_CTRL<1:m>. The test controller 240 may input an other part SPLIT_CTRL<k+1:m> of the characteristic calibration signal CTRL<1:m> to the transmitter 230 according to, in one example, the first enable signal DIRECT_SEL_EN_UP and the external select signal IN_PAD.

The test controller 240 may generate the latch signal SPLIT_CTRL<1:m> by latching the characteristic calibration signal CTRL<1:m> according to the first enable signal DIRECT_SEL_EN_UP and the external select signal IN_PAD. In other words, the test controller 240 may input the characteristic calibration signal CTRL<1:m> to the receiver 220 according to the external input.

The test controller 240 may reset the latch signal SPLIT_CTRL<1:m> according to the reset signal RSTB_UP.

Figure 8:
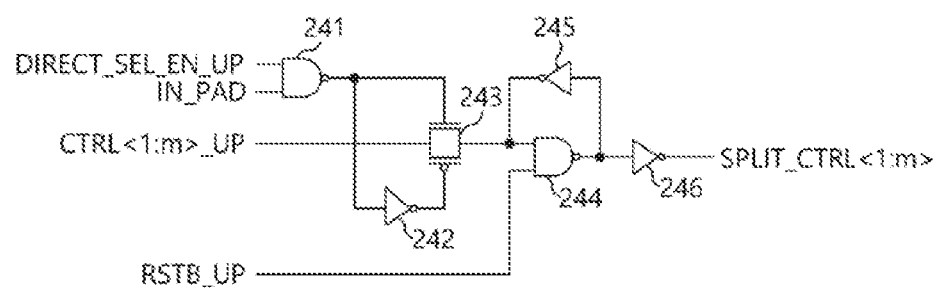
FIG. 8 is a diagram illustrating a configuration of a test controller of FIG. 7.

As illustrated in FIG. 8, the test controller 240 may include first to sixth logic gates 241 to 246.

The first logic gate 241 may perform a NAND operation on the first enable signal DIRECT_SEL_EN and the external select signal IN_PAD.

The second logic gate 242 may invert an output of the first logic gate 241.

The third logic gate 243 may pass the characteristic calibration signal CTRL<1:m> when the output of the first logic gate 241 is at a predetermined logic level, for example, a logic high level.

The fourth to sixth logic gates 244 to 246 may latch the output of the third logic gate 243, and output the latched signal as the latch signal SPLIT_CTRL<1:m>.

As the reset signal RSTB_UP is activated to a logic level, for example, the fourth logic gate 244 may reset the latch signals SPLIT_CTRL<1:m> to a logic low level.

For convenience of description, FIG. 8 illustrates only one of the third to sixth logic gates 243 to 246. However, the third to sixth logic gates 243 to 246 may correspond to the number of bits contained in the characteristic calibration signal CTRL<1:m>.

Now, an input/output terminal characteristic calibration method of the semiconductor apparatus 100 according to the present embodiment will be described with reference to FIGS. 2 to 8.

First, as the first enable signal DIRECT_SEL_EN_UP is retained at an inactive level, for example, a logic low level, the semiconductor apparatus 100 may be operate in the common calibration mode for calibrating characteristics of the plurality of input/output terminals 200 in common.

Because the first enable signal DIRECT_SEL_EN_UP is at an inactive level, for example, a logic low level, a characteristic calibration signal CTRL<1:m> may be provided to the plurality of input/output terminals 200 (refer to FIG. 8) in common. Thus, characteristics of the plurality of input/output terminals 200 may be calibrated in common.

The semiconductor apparatus 100 may enter the independent calibration mode in which the first enable signal DIRECT_SEL_EN_UP is activated to a logic high level and levels of the pads of the respective input/output terminals 200, that is, a level of the external select signal IN_PAD is adjusted to independently calibrate characteristics of the plurality of input/output terminals 200.

At this time, before a characteristic calibration signal CTRL<1:m> having an independent value is inputted to each of the input/output terminals 200, a signal value reset operation may be performed to reset the value of the characteristic calibration signal CTRL<1:m> which is already stored in the plurality of input/output terminals 200. Accordingly, the plurality of input/output terminals 200 may reset the characteristic calibration signal CTRL<1:m> according to the reset signal RSTB.

The signal value reset operation may be performed according to a low-pulse reset signal RSTB_UP which is generated in a state where the first enable signal DIRECT_SEL_EN_UP is activated to a logic high level and the external select signals IN_PAD inputted through all of the input/output terminals 200 are retained at a logic high level to block the input of the characteristic calibration signal CTRL<1:m>.

While the first enable signal DIRECT_SEL_EN_UP is retained at a logic high level after the signal value reset operation is finished, the low-pulse external select signal IN_PAD may be inputted to the pad or pads 210 of one or more input/output terminals 200 which are to be calibrated, among the plurality of input/output terminals 200.

At this time, the external select signals IN_PAD inputted through the pads 210 of the input/output terminals 200 which are not to be calibrated may be retained at a logic high level.

Among the plurality of input/output terminals 200, the input/output terminal 200 receiving the low-pulse external select signal IN_PAD may receive the characteristic calibration signal CTRL<1:m>, and the other input/output terminals 200 may be blocked from receiving the characteristic calibration signal CTRL<1:m>.

The input/output terminal 200 receiving the low-pulse external select signal IN_PAD may store the characteristic calibration signal CTRL<1:m>.

Then, a normal operation may be performed, and a corresponding input/output signal of the semiconductor apparatus 100 may be monitored to evaluate the operation characteristics of the input/output terminals 200.

If necessary, the above-described process, that is, the process of selecting another input/output terminal 200 to store a characteristic calibration signal CTRL<1:m> having an independent value, performing a normal operation, and evaluating the operation characteristics through monitoring may be repeated.

Therefore, as the characteristic calibration signals CTRL<1:m> having independent values are stored in the plurality of input/output terminals 200, the operation characteristics of the input/output terminals 200 may be independently calibrated.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. An input/output terminal characteristic calibration circuit comprising:
a plurality of input/output terminals configured to be selected by an external input, wherein at least one of the plurality of input/output terminals selected by the external input is configured to receive a characteristic calibration signal, such that characteristics of the input/output terminals corresponding to the characteristic calibration signal are calibrated; and
a characteristic calibration signal generation circuit configured to provide the characteristic calibration signal to the plurality of input/output terminals in common through a test signal line.

2. The input/output terminal characteristic calibration circuit according to claim 1, wherein the characteristic calibration signal comprises a plurality of signal bits corresponding to the types of operation characteristic-related items of the plurality of input/output terminals.

3. The input/output terminal characteristic calibration circuit according to claim 1, wherein each of the input/output terminals comprises a pad.

4. The input/output terminal characteristic calibration circuit according to claim 3, wherein the pad comprises a DQ pad.

5. The input/output terminal characteristic calibration circuit according to claim 3, wherein the external input is provided through the pad.

6. The input/output terminal characteristic calibration circuit according to claim 1, wherein the characteristic calibration signal generation circuit is configured to generate the characteristic calibration signal according to a mode register set signal.

7. The input/output terminal characteristic calibration circuit according to claim 1, wherein each of the input/output terminals comprises:
a pad;
a receiver coupled to the pad; and
a test controller configured to input the characteristic calibration signal to the receiver according to the external input.

8. An input/output terminal characteristic calibration circuit comprising:
a plurality of input/output terminals configured to be selected by an external select signal inputted through a pad and a first enable signal, and at least one of the plurality of input/output terminals selected by the external select signal is configured to receive a characteristic calibration signal, such that characteristics of the input/output terminals corresponding to the characteristic calibration signal are calibrated; and
a characteristic calibration signal generation circuit configured to generate the first enable signal and the characteristic calibration signal and provide the first enable signal and the characteristic calibration signal to the plurality of input/output terminals in common through a test signal line.

9. The input/output terminal characteristic calibration circuit according to claim 8, wherein the characteristic calibration signal comprises a plurality of signal bits corresponding to the types of operation characteristic-related items of the plurality of input/output terminals.

10. The input/output terminal characteristic calibration circuit according to claim 8, wherein the pad comprises a DQ pad.

11. The input/output terminal characteristic calibration circuit according to claim 8, wherein the characteristic calibration signal generation circuit is configured to generate the first enable signal and the characteristic calibration signal according to a mode register set signal.

12. The input/output terminal characteristic calibration circuit according to claim 8, wherein each of the input/output terminals comprises:
a pad;
a receiver coupled to the pad;
a transmitter coupled to the pad; and
a test controller configured to input a part of the characteristic calibration signal to the receiver and input the other part of the characteristic calibration signal to the transmitter, according to the first enable signal and the external select signal.

13. The input/output terminal characteristic calibration circuit according to claim 8, wherein the plurality of input/output terminals are configured to reset the characteristic calibration signal which is already stored therein, according to a reset signal.

14. The input/output terminal characteristic calibration circuit according to claim 13, wherein the characteristic calibration signal generation circuit is configured to generate the reset signal according to the first enable signal.

15. A semiconductor apparatus comprising:
an input/output terminal characteristic calibration circuit configured to select one or more of a plurality of input/output terminals according to an external input which is input through each of the plurality of input/output terminals, and input a characteristic calibration signal to the selected input/output terminals in common through a test signal line such that characteristic of the selected input/output terminals are calibrated; and
a memory core coupled to the plurality of input/output terminals through a global input/output line.

16. The semiconductor apparatus according to claim 15, wherein the input/output terminal characteristic calibration circuit comprises a characteristic calibration signal generation circuit configured to provide the characteristic calibration signal to the plurality of input/output terminals in common through the test signal line.

17. The semiconductor apparatus according to claim 16, wherein the characteristic calibration signal generation circuit is configured to generate the characteristic calibration signal according to a mode register set signal.

18. The semiconductor apparatus according to claim 15, wherein the external input comprises a pulse signal inputted from an external device of the semiconductor apparatus through a pad of any one of the plurality of input/output terminals.

19. The semiconductor apparatus according to claim 15, wherein the characteristic calibration signal comprises a plurality of signal bits corresponding to the types of operation characteristic-related items of the plurality of input/output terminals.

20. The semiconductor apparatus according to claim 15, wherein each of the input/output terminals comprises:
a pad;
a receiver coupled to the pad; and
a test controller configured to input the characteristic calibration signal to the receiver according to the external input to the pad.

* * * * *